United States Patent [19]

Kitano

[11] Patent Number: 5,895,941

[45] Date of Patent: Apr. 20, 1999

[54] FIELD EFFECT TRANSISTOR WITH ELECTRODE PORTIONS UNDER T-SHAPED GATE STRUCTURE

[75] Inventor: Toshiaki Kitano, Tokyo, Japan

[73] Assignee: Mitsubishi Denki Kabushiki Kaisha, Tokyo, Japan

[21] Appl. No.: 08/901,788

[22] Filed: Jul. 28, 1997

Related U.S. Application Data

[62] Division of application No. 08/675,305, Jul. 1, 1996, Pat. No. 5,696,035.

[51] Int. Cl.[6] .................................. H01L 31/0328
[52] U.S. Cl. .................... 257/194; 259/183; 259/187; 259/200; 259/201; 257/202; 257/192; 257/193; 257/194
[58] Field of Search ............................ 257/134, 183, 257/187, 200, 202, 192–194, 280–283

[56] References Cited

U.S. PATENT DOCUMENTS

| | | | |
|---|---|---|---|
| 5,139,968 | 8/1992 | Hayase et al. | 438/137 |
| 5,270,798 | 12/1993 | Pao et al. | 257/183 |
| 5,419,808 | 5/1995 | Kitano | 156/656.1 |
| 5,468,343 | 11/1995 | Kitano | 156/656.1 |
| 5,486,710 | 1/1996 | Kitano | 257/192 |
| 5,621,228 | 4/1997 | Ando | 257/194 |
| 5,677,553 | 10/1997 | Yamamoto et al. | 257/194 |

FOREIGN PATENT DOCUMENTS 5144848  6/1993  Japan .

*Primary Examiner*—Fetsum Abraham
*Attorney, Agent, or Firm*—Leydig, Voit & Mayer

[57] ABSTRACT

A semiconductor device includes an InP substrate; an undoped InAlAs buffer layer, an undoped InGaAs active layer, and an n type InAlAs electron supply layer successively disposed on the InP substrate; a T-shaped gate electrode on the n type electron supply layer, the T-shaped gate electrode having an upper overhanging part; n type InGaAs cap layers disposed on the n type electron supply layer at opposite sides of and spaced apart from the T-shaped gate electrode, each cap layer having a portion positioned beneath the upper overhanging part of the T-shaped gate electrode; and a source electrode and a drain electrode respectively disposed on the cap layers, each of these electrodes having a portion positioned beneath the upper overhanging part of the T-shaped gate electrode.

2 Claims, 10 Drawing Sheets

FIELD EFFECT TRANSISTOR WITH ELECTRODE PORTIONS UNDER T-SHAPED GATE STRUCTURE

This disclosure is a division of patent application Ser. No. 08/675,305, filed Jul. 1, 1996, now allowed with U.S. Pat. No. 5,696,035.

FIELD OF THE INVENTION

The present invention relates to an etchant and an etching method employed for fabrication of a semiconductor device, such as a MESFET (metal-semiconductor field effect transistor) or a HEMT (high electron mobility transistor). The invention also relates to a semiconductor device, such as a MESFET or a HEMT, and a method of fabricating the semiconductor device.

BACKGROUND OF THE INVENTION

An etchant that etches WSi selectively with respect to InAlAs or InGaAs, i.e., an etchant that etches WSi at a very high etching rate and etches InAlAs or InGaAs at a very low etching rate, has not been discovered so far. Therefore, RIE (reactive ion etching) or the like has been employed when a WSi layer on an InGaAs or InAlAs layer is etched selectively with respect to the InGaAs or InAlAs layer.

FIGS. 9(a)–9(d) are cross-sectional views illustrating process steps in a conventional method of fabricating a MESFET. In these figures, reference numeral 1 designates a semi-insulating InP substrate, numeral 2 designates an undoped InP buffer layer, numeral 3 designates an n type active layer comprising Si-doped InAlAs or InGaAs, numeral 4 designates a WSi layer, numerals 4a and 4b designate a source electrode and a drain electrode both comprising WSi, respectively, numeral 5 designates a gate electrode comprising Ti/Al, and numerals 6a and 6b designate a first photoresist and a second photoresist, respectively.

A description is given of the fabrication process.

Initially, as illustrated in FIG. 9(a), a buffer layer 2 and an n type active layer 3 are grown on an InP substrate 1 by MBE (molecular beam epitaxy) or MOCVD (metal organic chemical vapor deposition), and a WSi layer 4 is deposited on the n type active layer 3 by sputtering.

In the step of FIG. 9(b), a first photoresist 6a is formed on the WSi layer 4 and patterned by conventional photolithographic techniques to form an opening opposite a region where a gate electrode is later fabricated. Using the photoresist 6a as a mask, a portion of the WSi layer 4 which is exposed in the opening of the photoresist 6a is etched and removed selectively with respect to the n type active layer 3 by RIE. Preferably, a fluorine-based gas mixture, such as $SF_6$ and $CHF_3$, is used in the RIE process. As a result of the RIE, a source electrode 4a and a drain electrode 4b are produced.

After removal of the photoresist 6a, as illustrated in FIG. 9(c), a second photoresist 6b is formed on the source and drain electrodes 4a and 4b and on the n type active layer 3, and the photoresist 6b is patterned by conventional photolithographic techniques to form an opening opposite a central region between the source electrode 4a and the drain electrode 4b. Using the photoresist 6b as a mask, a Ti/Al layer is deposited by EB (Electron Beam) deposition, and unnecessary portions of the Ti/Al layer on the photoresist 6b are removed with the photoresist 6b by the lift-off technique, producing a gate electrode 5 (FIG. 9(d)).

In the conventional process of fabricating process of a MESFET, when the spaced apart source and drain electrodes 4a and 4b are produced, a portion of the WSi layer 4 must be removed selectively with respect to the n type active layer 3 comprising Si-doped InAlAs or InGaAs. However, since an etchant that etches WSi selectively with respect to InAlAs or InGaAs has not been discovered yet, the WSi layer 4 is etched by RIE as shown in FIG. 9(b). Since the RIE process employs a fluorine-based gas mixture, such as $SF_6$ and $CHF_3$, fluorine adheres to the n type active layer 3 that is exposed as a result of the RIE and infiltrates into the active layer 3. In the n type active layer 3, the fluorine combines with Si that is a dopant impurity of the active layer 3, whereby the carrier concentration of the active layer 3 is reduced. As a result, the FET characteristics are degraded.

FIGS. 10(a)–10(c) are cross-sectional views illustrating process steps in a conventional method of fabricating an HEMT with a T-shaped gate electrode. In the figures, reference numeral 11 designates a semi-insulating InP substrate, numeral 12 designates an undoped InAlAs buffer layer, numeral 13 designates an undoped InGaAs active layer, and numeral 14 designates an electron supply layer. The electron supply layer 14 comprises an Si planar doped layer 14a, i.e., a layer two-dimensionally doped with Si in a concentration of $4 \times 10^{12}$ cm$^{-2}$, and an undoped InAlAs layer 14b having a thickness of about 300 Å. Reference numeral 15 designates an n type InGaAs cap layer about 300 Å thick. The cap layer 15 is doped with an n type producing impurity in a concentration of about $5 \times 10^{18}$ cm$^{-3}$ so that it makes an ohmic contact with a source electrode and a drain electrode disposed thereon. Reference numeral 15a designates a gate recess formed in the cap layer 15. Reference numerals 16a and 16b designate a source electrode and a drain electrode, respectively, both comprising WSi about 1000 Å thick. Reference numeral 19 designates a gate electrode comprising Ti/Al. Reference numeral 17 designates an EB (electron beam) resist, and numeral 18 designates a photoresist.

A description is given of the fabrication process.

Initially, there are successively grown on an InP substrate 11, an undoped InAlAs buffer layer 12, an undoped InGaAs active layer 13, an Si planar doped layer 14a, an undoped InAlAs layer 14b, and an n type InGaAs cap layer 15. Preferably, these layers are grown by MBE (Molecular Beam Epitaxy) or MOCVD (Metal Organic Chemical Vapor Deposition). Thereafter, an EB resist 17 and a photoresist 18 are formed on the cap layer 15, and a portion of the photoresist 18 opposite a region where a gate electrode is later fabricated is removed using conventional photolithographic techniques to form an opening having a width of about 0.5 μm. Further, a portion of the EB resist 17 in the center of the opening of the photoresist 18 is removed by conventional photolithographic techniques using electron beam exposure, forming an opening having a width of about 0.1 μm. The opening of the photoresist 18 and the opening of the EB resist 17 form an upper case Roman letter T at the cross-section perpendicular to the surface of the substrate 11 (FIG. 10(a)).

Using the photoresist 18 and the EB resist 17 as masks, the n type InGaAs cap layer 15 exposed in the opening of the EB resist 17 is wet-etched with an inorganic acid mixture, such as $H_3PO_4$ and $H_2O_2$, to a gate recess 15a (FIG. 10(b)). Since the gate recess 15a is formed by the isotropic wet etching, the width of the recess 15a is larger than the width of the opening of the EB resist 17.

In the step of FIG. 10(c), using the photoresist 18 and the EB resist 17 as masks, a gate metal, such as Ti/Au, is deposited by evaporation, and unnecessary portions of the gate metal are removed with the photoresist 18 and the EB resist 17 by the lift-off technique, thereby producing a gate electrode 19 having a T shape at the cross-section perpendicular to the surface of the substrate 11.

Finally, using an upper overhanging part of the T-shaped gate electrode 19 as a mask, WSi is deposited on the cap layer 15 by EB deposition, producing a source electrode 16a and a drain electrode 16b (FIG. 10(d)).

The width of the upper overhanging part of the T-shaped gate electrode 19 is about 0.5 μm, and the source electrode 16a and the drain electrode 16b are not produced beneath the overhanging part, so that the space between the source electrode 16a and the drain electrode 16b (hereinafter referred to as source to drain distance) is about 0.5 μm. Although it is not shown in the figure, regions of the cap layer 15 where the source electrode 16a and the drain electrode 16b are not produced are masked with a resist or the like in advance. Further, in the step of FIG. 10(d), since a WSi layer (not shown) is deposited on the top of the T-shaped gate electrode 19, at least a part of the gate electrode 19 where bonding is later performed should be masked or the WSi layer on that part should be removed by etching or the like.

In the above-described method of fabricating an HEMT, since the source electrode 16a and the drain electrode 16b are formed by evaporation using the upper overhanging part of the T-shaped gate electrode 19 as a mask, the source to drain distance is equivalent to the width of the upper overhanging part of the T-shaped gate electrode 19, that is, the source to drain distance is restricted to the width of the upper overhanging part of the gate electrode 19. Since the source to drain distance cannot be reduced, the source resistance and the drain resistance cannot be reduced. As a result, the characteristics of the HEMT are not improved.

SUMMARY OF THE INVENTION

It is an object of the present invention to provide an etchant that can etch WSi selectively with respect to InAlAs or InGaAs.

It is another object of the present invention to provide an etching method that can etch WSi selectively with respect to InAlAs or InGaAs.

It is still another object of the present invention to provide a method of fabricating a semiconductor device in which, when a WSi layer on an InAlAs or InGaAs layer is etched and removed, no fluorine adheres to or infiltrates into the InAlAs or InGaAs layer.

It is a further object of the present invention to provide a method of fabricating a semiconductor device that makes the width of an upper part of a T-shaped gate electrode narrower than the source to drain distance.

It is a yet further object of the present invention to provide a semiconductor device in which the width of an upper part of a T-shaped gate electrode is narrower than the source to drain distance Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an etchant comprises an aqueous solution that contains citric acid, ammonium citrate, and hydrogen peroxide, and the mol ratio of ammonium citrate to citric acid is not less than 1. Using this etchant, WSi can be etched selectively with respect to InAlAs.

According to a second aspect of the present invention, in the above-described etchant, the mol ratio of ammonium citrate to citric acid is not less than 2. Using this etchant, WSi can be etched selectively with respect to InGaAs.

According to a third aspect of the present invention, in the above-described etchant, the mol ratio of ammonium citrate to citric acid is not less than 1 and less than 2. Using this etchant, WSi and InGaAs can be etched selectively with respect to InAlAs.

According to a fourth aspect of the present invention, an etching method comprises preparing a laminated structure comprising an InAlAs layer and a WSi layer disposed on the InAlAs layer; and removing the WSi layer selectively with respect to the InAlAs layer with an etchant comprising an aqueous solution that contains citric acid, ammonium citrate, and hydrogen peroxide, wherein the mol ratio of ammonium citrate to citric acid is not less than 1. In this method, the WSi layer can be etched selectively with respect to the InAlAs layer.

According to a fifth aspect of the present invention, an etching method comprises preparing a laminated structure comprising an InGaAs layer and a WSi layer disposed on the InGaAs layer; and removing the WSi layer selectively with respect to the InGaAs layer with an etchant comprising an aqueous solution that contains citric acid, ammonium citrate, and hydrogen peroxide, wherein the mol ratio of ammonium citrate to citric acid is not less than 2. In this method, the WSi layer can be etched selectively with respect to the InGaAs layer.

According to a sixth aspect of the present invention, an etching method comprises preparing a laminated structure comprising an InAlAs layer, an InGaAs layer disposed on the InAlAs layer, and a WSi layer disposed on the InGaAs layer; and removing the WSi layer and the InGaAs layer selectively with respect to the InAlAs layer with an etchant comprising an aqueous solution that contains citric acid, ammonium citrate, and hydrogen peroxide, wherein the mol ratio of ammonium citrate to citric acid is not less than 1 and less than 2. In this method, the WSi layer and the InGaAs layer can be etched selectively with respect to the InAlAs layer.

According to a seventh aspect of the present invention, a method of fabricating a semiconductor device comprises growing an undoped InAlAs buffer layer, an undoped InGaAs active layer, an n type InAlAs electron supply layer, and an n type InGaAs cap layer successively on an InP substrate; forming a WSi layer on the n type InGaAs cap layer; forming a resist on the WSi layer and patterning the resist to form an opening having a T-shaped cross section in the direction perpendicular to the substrate; using the resist as a mask, removing the WSi layer and the n type InGaAs cap layer selectively with respect to the n type InAlAs electron supply layer with an etchant comprising an aqueous solution that contains citric acid, ammonium citrate, and hydrogen peroxide, wherein the mol ratio of ammonium citrate to citric acid is not less than 1 and less than 2; and depositing a gate metal using the resist as a mask, and removing the resist to lift off portions of the gate metal on the resist, thereby producing a T-shaped gate electrode. In a semiconductor device so fabricated, a portion of the source electrode and a portion of the drain electrode are positioned beneath the upper overhanging part of the T-shaped gate electrode, so that the source to drain distance is narrower than the width of the upper part of the T-shaped gate electrode. As a result, the maximum cut-off frequency of the semiconductor device is increased.

According to an eighth aspect of the present invention, a method of fabricating a semiconductor device comprises growing an undoped InAlAs buffer layer and an n type InGaAs active layer on an InP substrate; forming a WSi layer on the n type active layer; forming a resist with an opening on the WSi layer; using the resist as a mask, removing the WSi layer selectively with respect to the n type InGaAs active layer with an etchant comprising an aqueous solution that contains citric acid, ammonium citrate, and hydrogen peroxide, wherein the mol ratio of ammonium citrate to citric acid is not less than 2; and depositing a gate metal using the resist as a mask, and removing the resist to lift off portions of the gate metal on the resist, thereby producing a gate electrode. In this method, when the WSi layer is etched to form the source and drain electrodes, unwanted adhesion or infiltration of fluorine to the n type InGaAs active layer as in the conventional method is avoided, whereby a high-quality semiconductor device is fabricated. In addition, since the resist used for etching of the WSi layer can be used as a mask for forming the gate electrode, the fabrication process is simplified.

According to a ninth aspect of the present invention, a semiconductor device comprises an InP substrate; an undoped InAlAs buffer layer, an undoped InGaAs active layer, and an n type InAlAs electron supply layer successively disposed on the InP substrate; a T-shaped gate electrode disposed on the n type electron supply layer, the T-shaped gate electrode having an upper overhanging part; n type InGaAs cap layers disposed on the n type electron supply layer at both sides of and spaced apart from the T-shaped gate electrode, each cap layer having a portion positioned beneath the upper overhanging part of the T-shaped gate electrode; and a source electrode and a drain electrode respectively disposed on the cap layers, each of these electrodes having a portion positioned beneath the upper overhanging part of the T-shaped gate electrode. In this semiconductor device, a portion of the source electrode and a portion of the drain electrode are positioned beneath the upper overhanging part of the T-shaped gate electrode, so that the source to drain distance is narrower than the width of the upper part of the T-shaped gate electrode. As a result, the maximum cut-off frequency of the semiconductor device is increased.

DETAILED DESCRIPTION OF THE PREFERRED EMBODIMENTS

Embodiment 1

An etchant according to a first embodiment of the present invention, that is, an aqueous solution comprising citric acid, ammonium citrate, and hydrogen peroxide in which the mol ratio (x) of ammonium citrate to citric acid is not less than 1 ($1 \leq x$), will be described with reference to FIG. 1.

Figure 1:
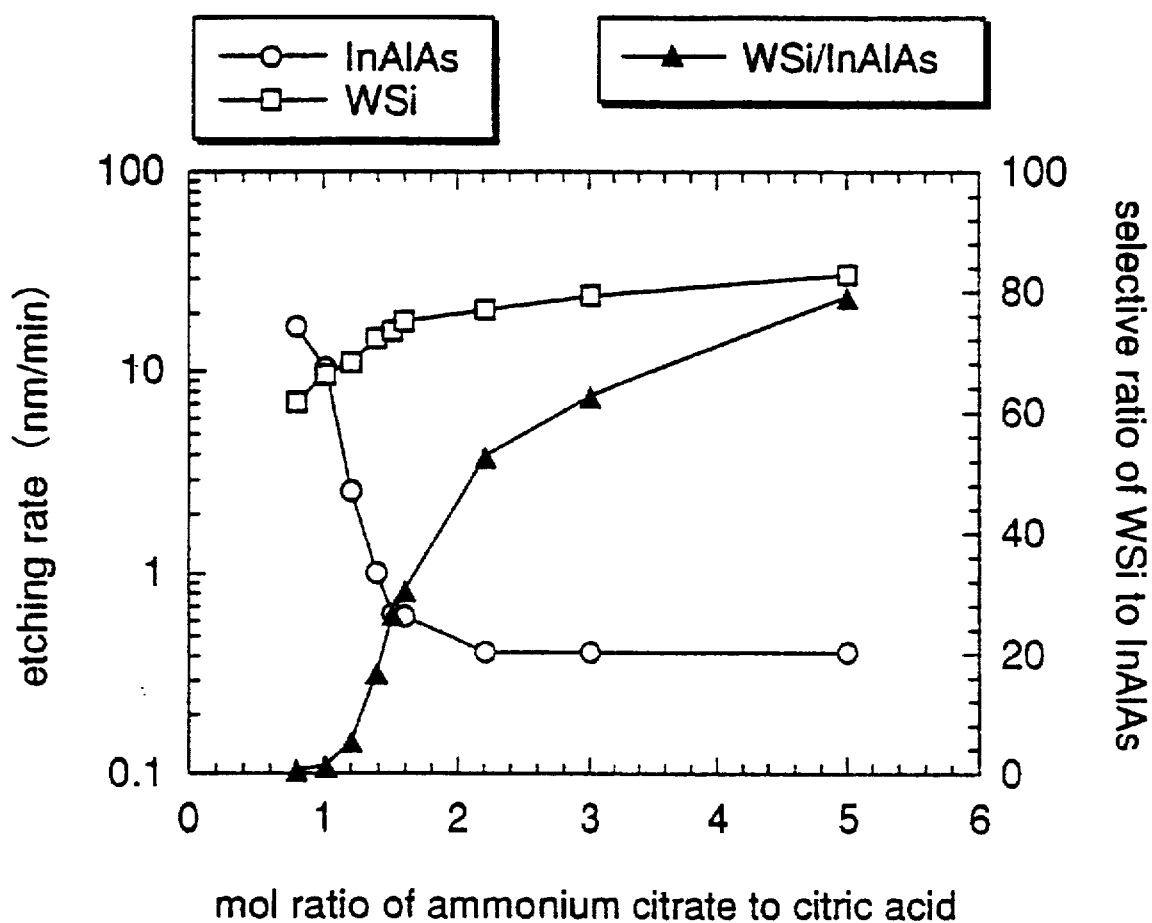
FIG. 1 is a graph illustrating the relationship between the etching rates of WSi and InAlAs by an etchant according to a first embodiment of the invention and the mixture ratio (mol ratio) of ammonium citrate to citric acid.

FIG. 1 is a graph illustrating dependence of the etching rates of WSi and InAlAs by an etchant comprising a mixture of an aqueous solution of ammonium citrate and an aqueous solution of citric acid on the mixture ratio (mol ratio) of ammonium citrate to citric acid. In the graph, the abscissa shows the mol ratio of ammonium citrate to citric acid in the etchant, the ordinate on the left side shows the etching rate (nm/min), and the ordinate on the right side shows the ratio of the etching rate of WSi by the etchant to the etching rate of InAlAs by the etchant, i.e., the selective etching ratio of WSi to InAlAs. In addition, the circles show the etching rate of InAlAs by the etchant, the squares show the and etching rate of WSi by the etchant, and triangles show the selective ratio of WSi to InAlAs which is obtained from the etching rate of WSi and the etching rate of InAlAs. This etchant is obtained by mixing an aqueous solution of ammonium citrate having a concentration of 5 wt % with an aqueous solution of citric acid having a concentration of 5 wt % and controlling the mol ratio of ammonium citrate to citric acid. Further, this etchant includes hydrogen peroxide having a concentration of 30 wt %, the volume of which amounts to about 4 vol % of the volume of the etchant.

A description is given of an etchant according to the first embodiment of the invention. In the experiment shown in FIG. 1 where InAlAs and WSi are etched with the etchant comprising a mixture of an aqueous solution of ammonium citrate and an aqueous solution of citric acid, and hydrogen peroxide of 4 vol %, when the mol ratio of ammonium citrate to citric acid exceeds 1, the etching rate of WSi exceeds the etching rate of InAlAs, and the selective ratio of WSi to InAlAs increases with an increase in the mol ratio, so that WSi can be etched selectively with respect to InAlAs. From this fact, it is found that WSi can be etched selectively with respect to InAlAs with an etchant comprising an aqueous solution that contains citric acid, ammonium citrate, and hydrogen peroxide in which the mol ratio of ammonium citrate to citric acid is not less than 1.

Figure 2:
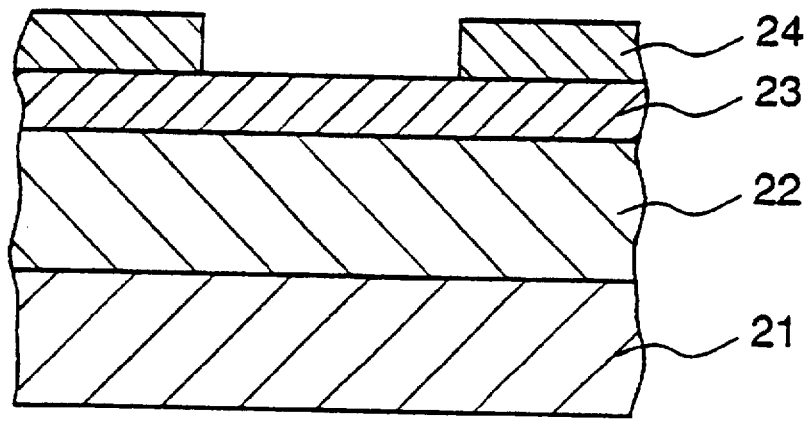
FIGS. 2(a) and 2(b) are cross-sectional views illustrating process steps in an etching method according to the first embodiment of the invention.
Figure 2:
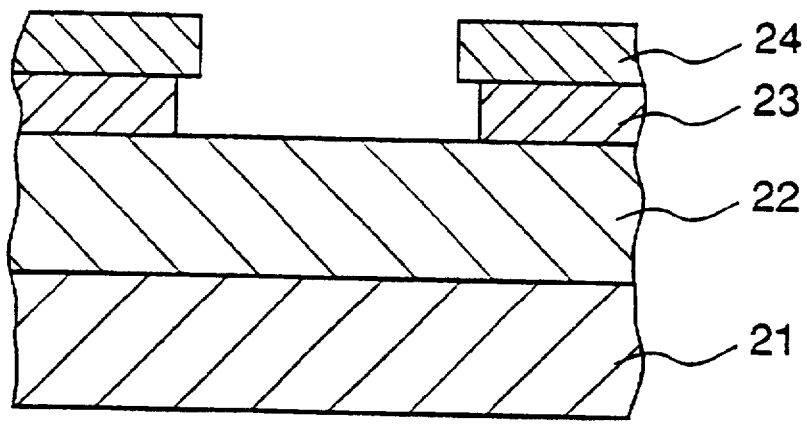

FIGS. 2(a) and 2(b) are cross-sectional views illustrating process steps in an etching method using the etchant according to the first embodiment of the invention. In the figures, reference numeral 21 designates an InP substrate, numeral 22 designates an InAlAs layer, numeral 23 designates a WSi layer, and numeral 24 designates a photoresist.

Initially, an InAlAs layer 22 having an In composition which is controlled so that it lattice-matches with InP is grown on the InP substrate 21, and $WSi_{0.2}$ (W:Si=1:0.2) is deposited on the InAlAs layer 22 by sputtering, producing a laminated structure comprising the InP substrate 21, the InAlAs layer 22, and the $WSiO_{0.2}$ layer 23. Preferably, these layers are grown by MBE at a growth temperature of 450° C. and a V/III ratio (vapor pressure ratio) of 20. Thereafter, a photoresist 24 is formed on the $WSi_{0.2}$ layer 23 and patterned to form an opening in a prescribed region, resulting in a sample shown in FIG. 2(a).

Using the photoresist 24 as a mask, the $WSi_{0.2}$ layer 23 is etched with an etchant that is prepared by mixing an aqueous solution of ammonium citrate having a concentration of 5 wt % and an aqueous solution of citric acid having a concentration of 5 wt % so that the mol ratio of ammonium citrate to citric acid is 3 and adding hydrogen peroxide having a concentration of 30 wt % to the mixture so that the volume of the hydrogen peroxide is about 4 vol % of the volume of the etchant. As described above, since the etching rate of $WSi_{0.2}$ by this etchant is higher than the etching rate of InAlAs by this etchant, the $WSi_{0.2}$ layer 23 is etched selectively with respect to the InAlAs layer 22. Therefore, in the direction perpendicular to the surface of the substrate 21, the etching stops when the etching front reaches the InAlAs layer 22, whereby the etching depth can be controlled accurately. Since this etching is isotropic wet etching, the width of the etched portion of the $WSi_{0.2}$ layer 23 is larger than the width of the opening of the photoresist 24.

As described above, according to the first embodiment of the present invention, since an etchant comprising an aqueous solution that contains citric acid, ammonium citrate, and hydrogen peroxide in which the mol ratio of ammonium citrate to citric acid is not less than 1 is employed, WSi can be etched selectively with respect to InAlAs.

Embodiment 2

An etchant according to a second embodiment of the present invention, that is, an aqueous solution comprising citric acid, ammonium citrate, and hydrogen peroxide in which the mol ratio (x) of ammonium citrate to citric acid is not less than 2 ($2 \leq x$), will be described with reference to FIG. 3.

Figure 3:
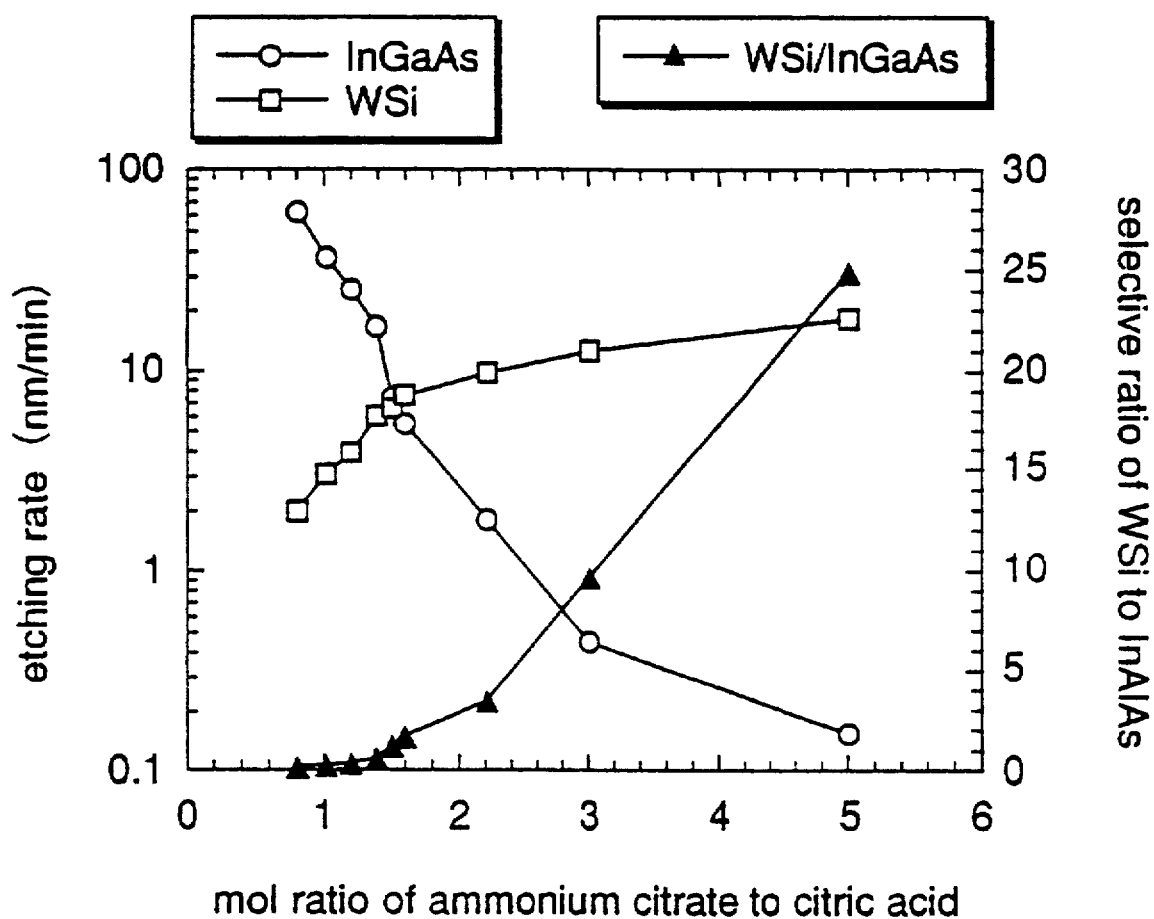
FIG. 3 is a graph illustrating the relationship between the etching rates of WSi and InGaAs by an etchant according to a second embodiment of the invention and the mixture ratio (mol ratio) of ammonium citrate to citric acid.

FIG. 3 is a graph illustrating dependence of the etching rates of WSi and InGaAs by an etchant comprising a mixture of an aqueous solution of ammonium citrate and an aqueous solution of citric acid on the mixture ratio (mol ratio) of ammonium citrate to citric acid. In the graph, the abscissa shows the mol ratio of ammonium citrate to citric acid in the etchant, the ordinate on the left side shows the etching rate (nm/min), and the ordinate on the right side shows the ratio of the etching rate of WSi by the etchant to the etching rate of InGaAs by the etchant, i.e., the selective ratio of WSi to InGaAs. In addition, the circles show the etching rate of InGaAs by the etchant, the squares show the etching rate of WSi by the etchant, and the triangles show the selective ratio of WSi to InGaAs that is obtained from the etching rate of WSi and the etching rate of InGaAs. This etchant is obtained by mixing an aqueous solution of ammonium citrate having a concentration of 5 wt % with an aqueous solution of citric acid having a concentration of 5 wt % and controlling the mol ratio of ammonium citrate to citric acid. Further, this etchant includes hydrogen peroxide having a concentration of 30 wt %, the volume of which amounts to about 4 vol % of the volume of the etchant.

A description is given of an etchant according to the second embodiment of the invention. In the experiment shown in FIG. 3 where InGaAs and WSi are etched with the etchant comprising a mixture of an aqueous solution of ammonium citrate and an aqueous solution of citric acid, and hydrogen peroxide of 4 vol %, when the mol ratio of ammonium citrate to citric acid exceeds 2, the etching rate of WSi exceeds the etching rate of InGaAs, and the selective ratio of WSi to InGaAs increases with an increase in the mol ratio, so that WSi can be etched selectively with respect to InGaAs. From this fact, it is found that WSi can be etched selectively with respect to InGaAs with an etchant comprising an aqueous solution that contains citric acid, ammonium citrate, and hydrogen peroxide in which the mol ratio of ammonium citrate to citric acid is not less than 2.

Figure 4:
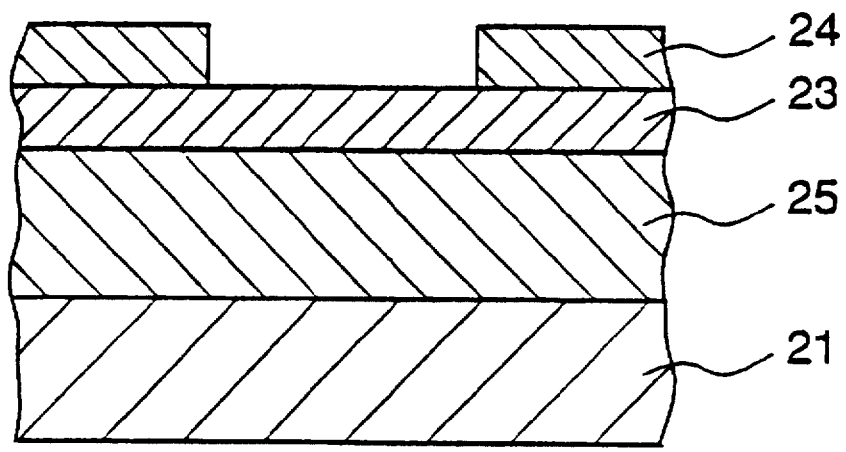
FIGS. 4(a) and 4(b) are cross-sectional views illustrating process steps in an etching method according to the second embodiment of the present invention.
Figure 4:
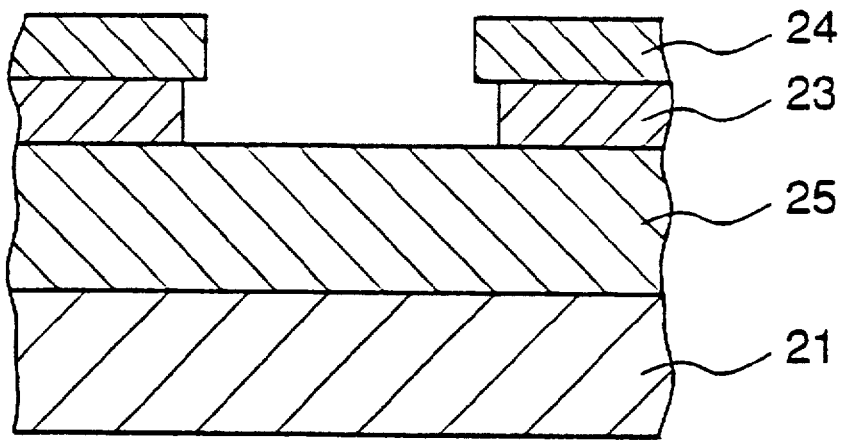

FIGS. 4(a) and 4(b) are cross-sectional views illustrating process steps in an etching method using the etchant according to the second embodiment of the invention. In the figures, the same reference numerals as those shown in FIGS. 2(a) and 2(b) designate the same or corresponding parts. Reference numeral 25 designates an InGaAs layer.

Initially, an InGaAs layer 25 having an In composition which is controlled so that it lattice-matches with InP is grown on the InP substrate 21, and $WSi_{0.2}$ (W:Si=1:0.2) is deposited on the InGaAs layer 25 by sputtering, producing a laminated structure comprising the InP substrate 21, the InGaAs layer 25, and the $WSi_{0.2}$ layer 23. Thereafter, a photoresist 24 is formed on the $WSi_{0.2}$ layer 23 and patterned to form an opening in a prescribed region, resulting in a sample shown in FIG. 4(a).

Using the photoresist 24 as a mask, the $WSi_{0.2}$ layer 23 is etched with an etchant that is prepared by mixing an aqueous solution of ammonium citrate having a concentration of 5 wt % and an aqueous solution of citric acid having a concentration of 5 wt % so that the mol ratio of ammonium citrate to citric acid is 5 and adding hydrogen peroxide having a concentration of 30 wt % to the mixture so that the volume of the hydrogen peroxide is about 4 vol % of the volume of the etchant. As described above, since the etching rate of $WSi_{0.2}$ by this etchant is higher than the etching rate of InGaAs by this etchant, the $WSi_{0.2}$ layer 23 is etched selectively with respect to the InGaAs layer 25. Therefore, in the direction perpendicular to the surface of the substrate, the etching stops when the etching front reaches the InGaAs layer 25, whereby the etching depth can be controlled accurately. Since this etching is isotropic wet etching, the width of the etched portion of the $WSi_{0.2}$ layer 23 is wider than the width of the opening of the photoresist 24.

As described above, according to the second embodiment of the present invention, since an etchant comprising an aqueous solution that contains citric acid, ammonium citrate, and hydrogen peroxide in which the mol ratio of ammonium citrate to citric acid is not less than 2 is employed, WSi can be etched selectively with respect to InGaAs.

Embodiment 3

Figure 5:
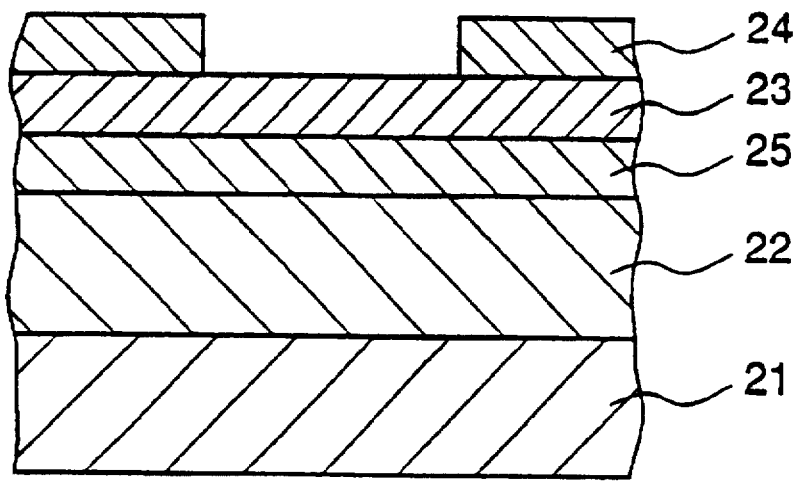
FIGS. 5(a) and 5(b) are cross-sectional views illustrating process steps in an etching method according to a third embodiment of the present invention.
Figure 5:
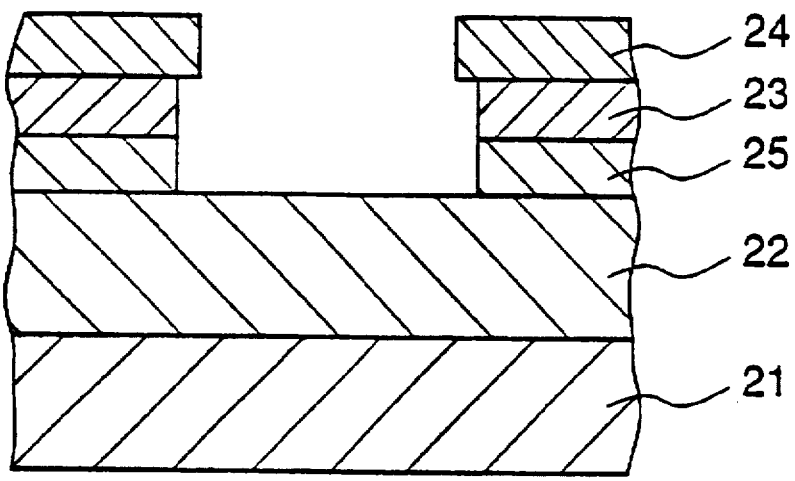

FIGS. 5(a) and 5(b) are cross-sectional views illustrating process steps in an etching method, according to a third embodiment of the present invention, with an etchant comprising an aqueous solution that contains citric acid, ammonium citrate, and hydrogen peroxide in which the mol ratio (x) of ammonium citrate to citric acid is not less than 1 and less than 2 ($1 \leq x < 2$). In these figures, the same reference numerals as those shown in FIGS. 2(a) and 2(b) designate the same or corresponding parts.

A description is given of an etchant according to this third embodiment of the invention. As already described with respect to the first and second embodiments of the invention, in an etchant comprising an aqueous solution that contains citric acid, ammonium citrate, and hydrogen peroxide, when the mol ratio of ammonium citrate to citric acid is not less than 1, WSi can be etched selectively with respect to InAlAs by this etchant, and when the mol ratio of ammonium citrate to citric acid is not less than 2, WSi can be etched selectively with respect to InGaAs by this etchant. So, when an etchant in which the mol ratio of ammonium citrate to citric acid is not less than 1 and less than 2 is employed, WSi and InGaAs can be etched selectively with respect to InAlAs.

A description is given of an etching method according to this third embodiment of the invention. Initially, an InAlAs layer 22 having an In composition that is selected so that it lattice-matches with InP, and an InGaAs layer 25 are successively grown on an InP substrate 21. Thereafter, WSi$_{0.2}$ (W:Si=1:0.2) is deposited on the InGaAs layer 25 by sputtering. Then, a photoresist 24 is formed on the WSi$_{0.2}$ layer 23 and patterned to form an opening in a prescribed region, thereby producing a sample shown in FIG. 5(a). In the step of FIG. 5(b), using the photoresist 24 as a mask, the sample is etched with the above-mentioned etchant. Since the etchant etches WSi and InGaAs selectively with respect to InAlAs, the WSi$_{0.2}$ layer 23 and the InGaAs layer 25 are etched, and the etching stops at the InAlAs layer 22. Therefore, the etching depth can be accurately controlled.

As described above, according to the third embodiment of the present invention, since an etchant comprising an aqueous solution that contains citric acid, ammonium citrate, and hydrogen peroxide in which the mol ratio of ammonium citrate to citric acid is not less than 1 and less than 2 is employed, WSi and InGaAs can be etched selectively with respect to InAlAs.

Although in the first to third embodiments of the invention the etchant contains 30 wt % hydrogen peroxide and the volume of the hydrogen peroxide is about 4 vol % of the volume of the etchant, the volume of the 30 wt % hydrogen peroxide may be in a range from 1 vol % to 10 vol % of the volume of the etchant.

Further, in the first to third embodiments of the invention, an etchant including a mixture of an aqueous solution of ammonium citrate having a concentration of 5 wt % and an aqueous solution of citric acid having a concentration of 5 wt % is employed. However, when the total of the concentrations of the ammonium citrate and the citric acid is lower than 50 wt % of the etchant, the same effects as described above are achieved.

Embodiment 4

Figure 6:
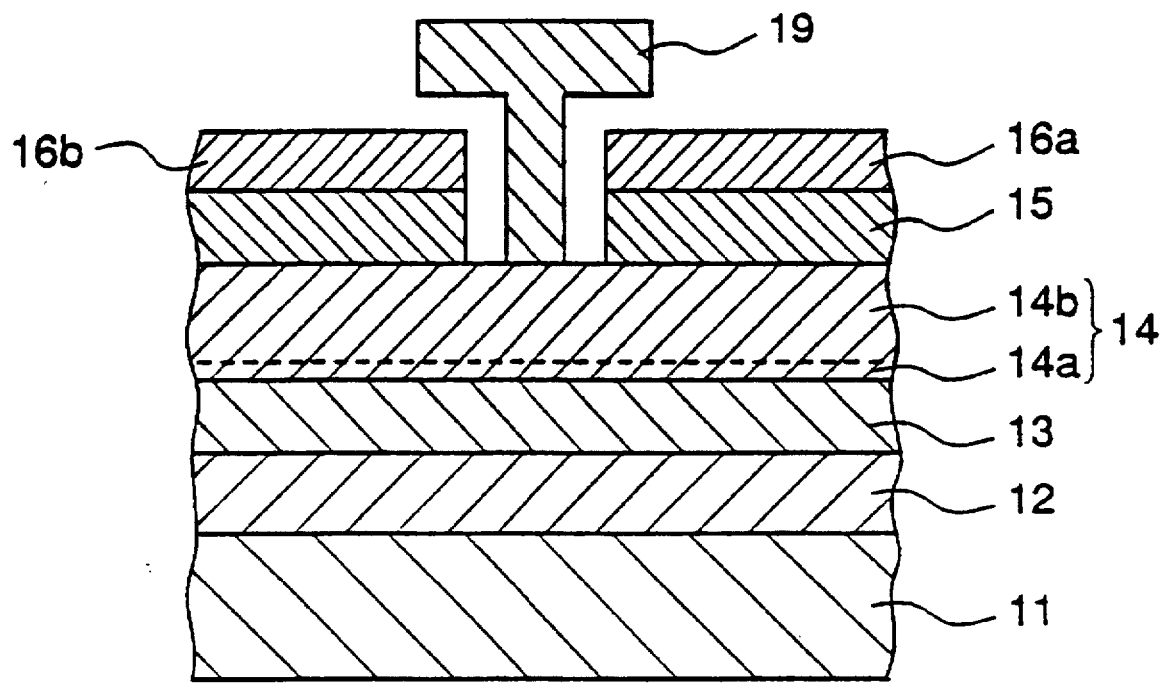
FIG. 6 is a cross-sectional view illustrating an HEMT having a T-shaped gate electrode according to a fourth embodiment of the present invention.

FIG. 6 is a cross-sectional view illustrating an HEMT having a T-shaped gate electrode according to a fourth embodiment of the present invention. In this fourth embodiment, the etchant according to the third embodiment of the invention is employed in formation of a source electrode and a drain electrode of the HEMT. In FIG. 6, reference numeral 11 designates a semi-insulating InP substrate. An undoped InAlAs buffer layer 12 is disposed on the substrate 1. An undoped InGaAs active layer 13 is disposed on the buffer layer 12. An n type InAlAs electron supply layer 14 is disposed on the active layer 13. The electron supply layer 14 comprises an Si planar doped layer 14a, i.e., a layer doped with Si in an atomic layer at a concentration of $4 \times 10^{12}$ cm$^{-2}$, and an undoped InAlAs layer 14b about 300 Å thick. In place of the electron supply layer 14, an electron supply layer doped with a dopant impurity in a high concentration may be used. An n type InGaAs cap layer 15 about 300 Å thick is disposed on the electron supply layer 14. A source electrode 16a and a drain electrode 16b, both comprising WSi and having a thickness of about 1000 Å, are disposed on the cap layer 15. The cap layer 15 is doped with an n type producing impurity in a concentration of about $5 \times 10^{18}$ cm$^{-3}$ so that it makes an ohmic contact with the source and drain electrodes 16a and 16b. A T-shaped gate electrode 19 comprising Ti/Al is disposed on the electron supply layer 14 between the source electrode 16a and the drain electrode 16b.

Figure 7:
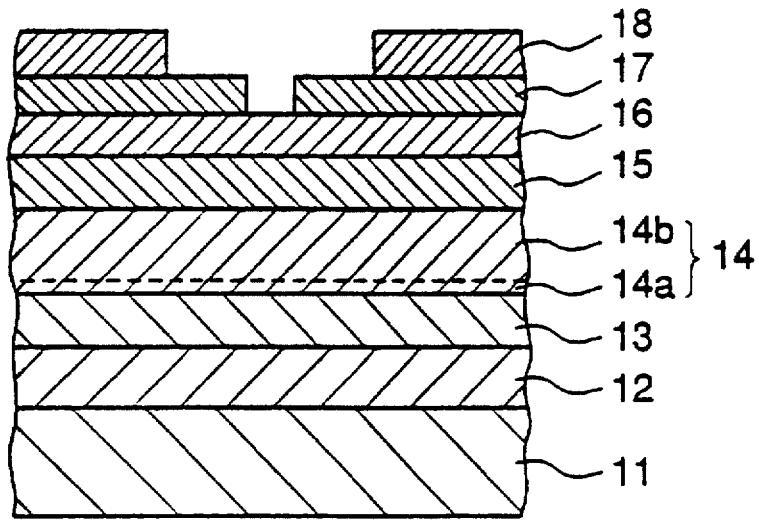
FIGS. 7(a) to 7(c) are cross-sectional views illustrating process steps in a method of fabricating the HEMT shown in FIG. 6.
Figure 7:
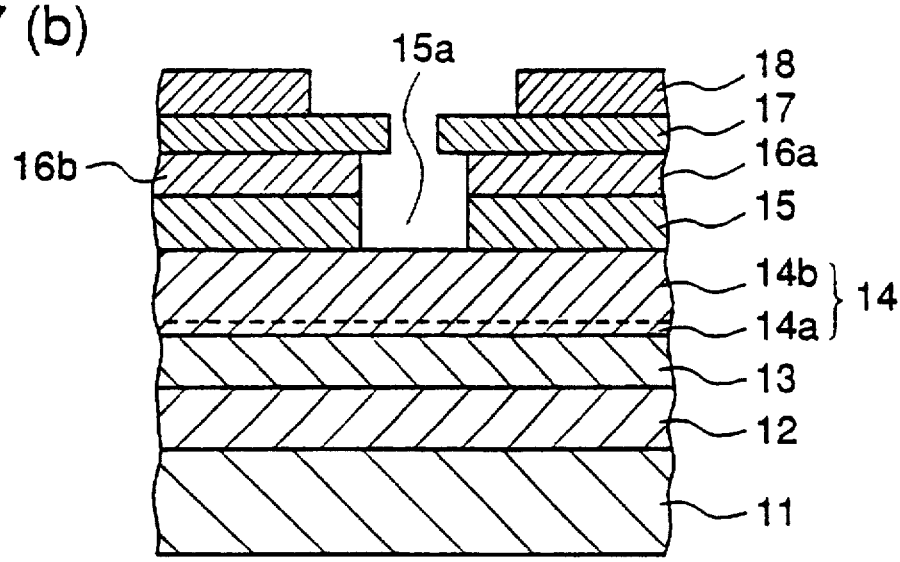
Figure 7:
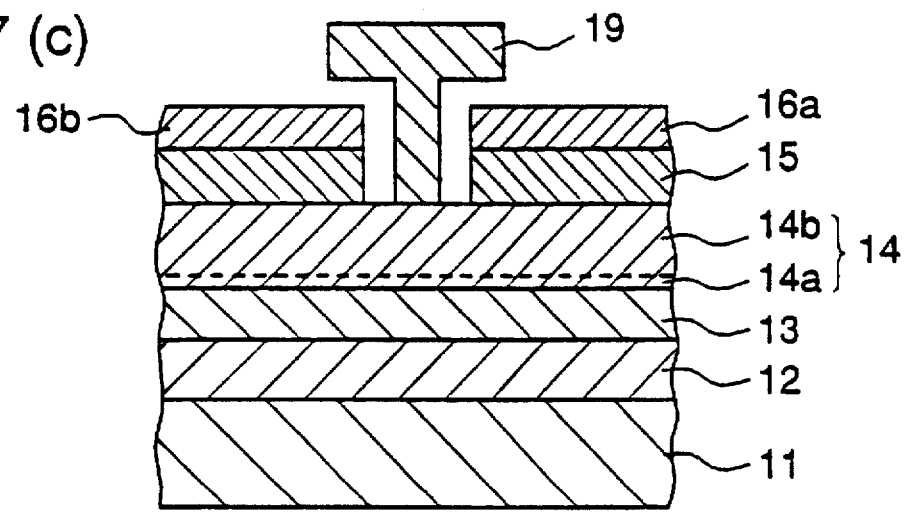

FIGS. 7(a)-7(c) are cross-sectional views illustrating process steps in a method of fabricating the HEMT shown in FIG. 6. In these figures, the same reference numerals as those shown in FIG. 6 designate the same or corresponding parts. Reference numeral 15a designates a gate recess, numeral 16 designates a WSi layer, numeral 17 designates an EB resist, and numeral 18 designates a photoresist.

A description is given of the fabrication process.

Initially, there are successively grown on the InP substrate 11 an undoped InAlAs buffer layer 12, an undoped InGaAs active layer 13, an Si planar doped layer 14a, an undoped InAlAs layer 14b, and an n type InGaAs cap layer 15. Preferably, these layers are grown by MBE or MOCVD. Thereafter, a WSi layer 16 is deposited on the cap layer 15 by sputtering, followed by an EB resist 17 and a photoresist 18. The photoresist 18 is patterned by conventional photolithographic techniques to form an opening about 0.5 μm wide in a region where a gate electrode is later fabricated. Further, a portion of the EB resist 17 in the center of the opening of the photoresist 18 is removed by photolithographic techniques using electron beam exposure, forming an opening about 0.1 μm wide. The opening of the photoresist 18 and the opening of the EB resist 17 form an upper case Roman letter T at the cross-section perpendicular to the surface of the substrate 11 (FIG. 7(a)).

In the step of FIG. 7(b), using the photoresist 18 and the EB resist 17 as masks, portions of the WSi layer 6 and the n type InGaAs cap layer 15 opposite the opening of the EB resist 17 are wet-etched with an etchant according to the third embodiment of the invention, i.e., an aqueous solution comprising citric acid, ammonium citrate, and hydrogen peroxide in which the mol ratio of ammonium citrate to citric acid is not less than 1 and less than 2. As a result of this etching, a source electrode 16a, a drain electrode 16b, and a gate recess 15a are produced. In the direction perpendicular to the surface of the substrate 11, the etching stops when the etching front reaches the InAlAs electron supply layer 14. Further, since this etching is isotropic wet etching, the widths of the openings of the WSi layer 16 and the n type InGaAs cap layer 15 are larger than the width of the opening of the EB resist 17. The thicknesses of the WSi layer 16 and the n type InGaAs cap layer 15 are controlled according to the etchant so that the source to drain distance and the width of the gate recess 15a are narrower than the width of the opening of the photoresist 18.

Finally, as illustrated in FIG. 7(c), using the photoresist 18 and the EB resist 17 as masks, a gate metal, such as Ti/Au, is deposited by evaporation, and unnecessary portions of the gate metal are removed with the photoresist 18 and the EB resist 17 by the lift-off technique, producing a gate electrode 19 having a T shape at the cross-section perpendicular to the surface of the substrate 11.

In the prior art method of fabricating an HEMT shown in FIGS. 10(a)-10(d), since the source and drain electrodes are produced by evaporation of WSi using the T-shaped gate electrode as a mask, the source to drain distance is restricted to the width of the upper part of the T-shaped gate electrode 19. In this fourth embodiment of the invention, however, since the source and drain electrodes 16a and 16b are produced by forming the WSi layer 16 in advance and wet-etching the WSi layer 16 using the etchant according to the third embodiment of the invention, portions of the source electrode 16a and the drain electrode 16b are positioned under the over-hanging portions of the upper part of the gate electrode 19, and the source to drain distance can be narrower than the width of the upper part of the T-shaped gate electrode 19. Therefore, the source to drain distance can approximate the width of the gate recess 15a, whereby the source resistance and the drain resistance can be reduced, resulting in an increase in the maximum cut-off frequency.

Further, since the WSi layer 16 and the n type InGaAs cap layer 15 are etched with the etchant that can etch WSi and InGaAs selectively with respect to InAlAs, in the direction perpendicular to the surface of the substrate 11, this etching stops at the InAlAs electron supply layer 14 with high accuracy. Therefore, the controllability of the etching for removing the WSi layer 16 and the n type InGaAs cap layer 15 to produce the gate recess 15a in the direction perpendicular to the surface of the substrate 11 can be improved, whereby high-quality HEMTs are fabricated at good yield.

Although emphasis has been placed upon an HEMT having a T-shaped gate electrode in this fourth embodiment of the invention, a similar semiconductor device, such as an FET, having a T-shaped gate electrode is within the scope of the invention.

Embodiment 5

Figure 8:
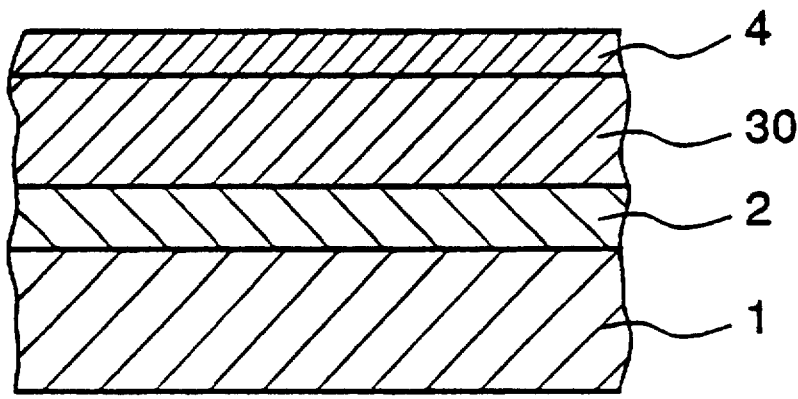
FIGS. 8(a) to 8(c) are cross-sectional views illustrating process steps in a method of fabricating a MESFET according to a fifth embodiment of the present invention
Figure 8:
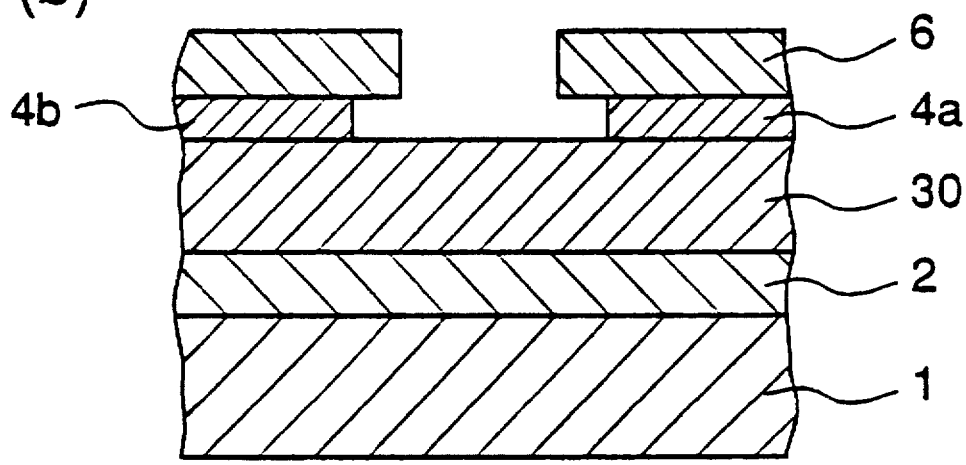
Figure 8:
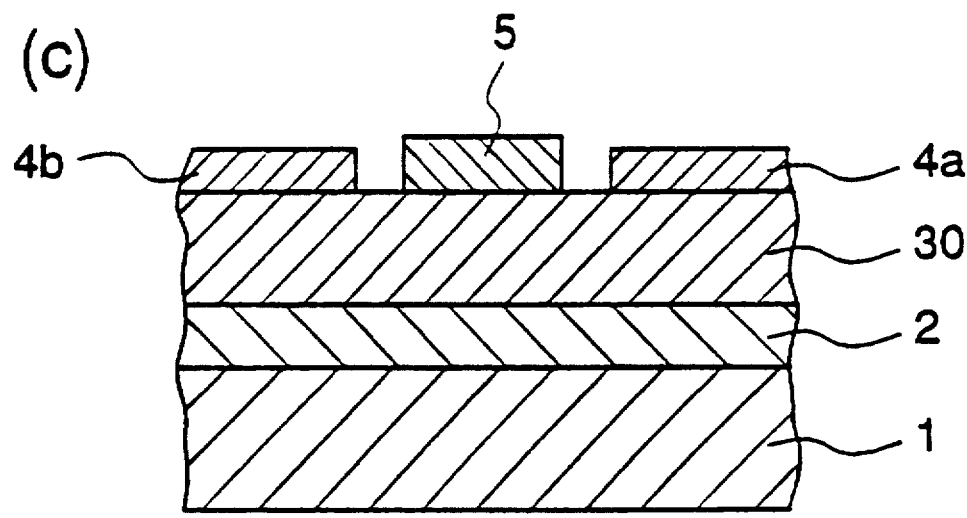
Figure 9:
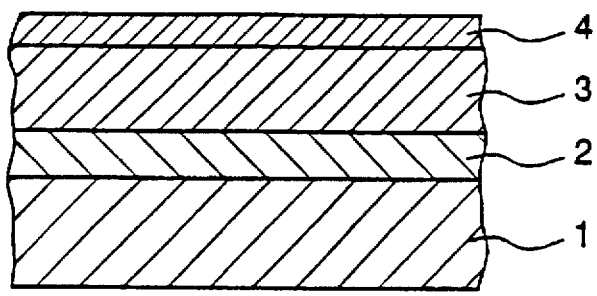
FIGS. 9(a) to 9(d) are cross-sectional views illustrating process steps in a method of fabricating a MESFET according to the prior art.
Figure 9:
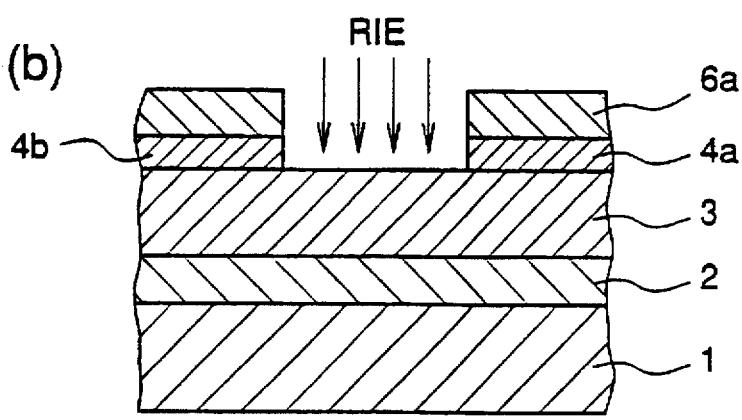
Figure 9:
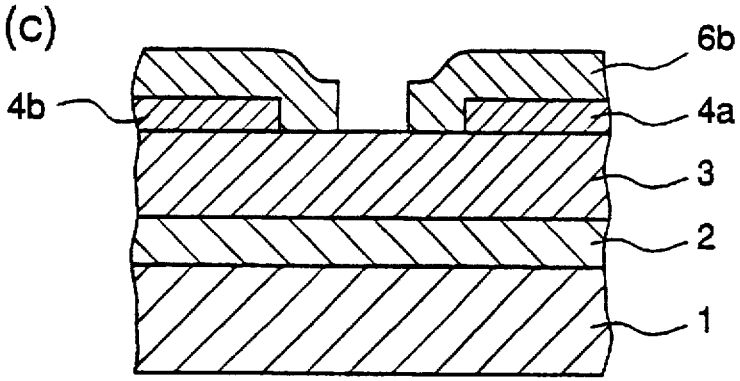
Figure 9:
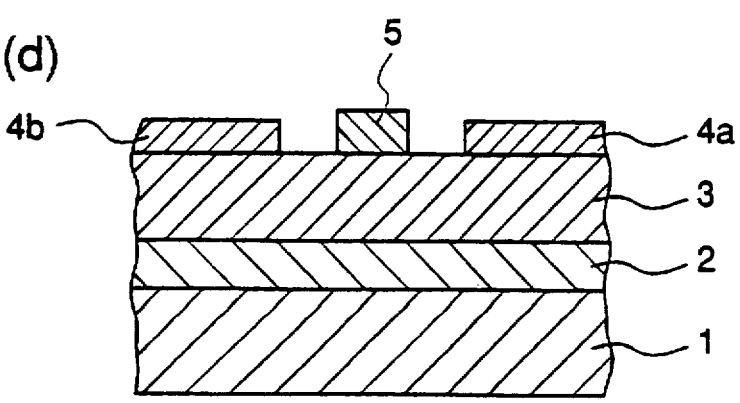
Figure 10:
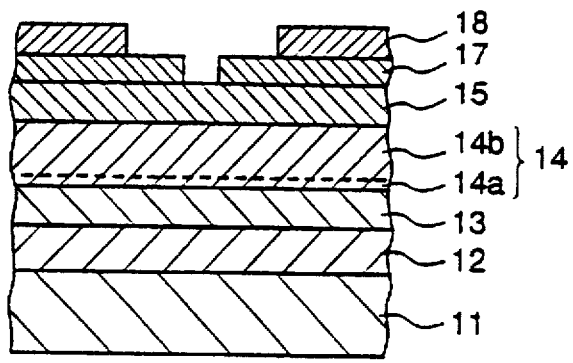
FIGS. 10(a) to 10(d) are cross-sectional views illustrating process steps in a method of fabricating an HEMT according to the prior art.
Figure 10:
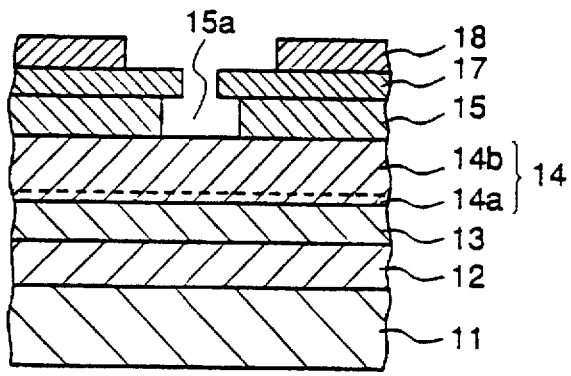
Figure 10:
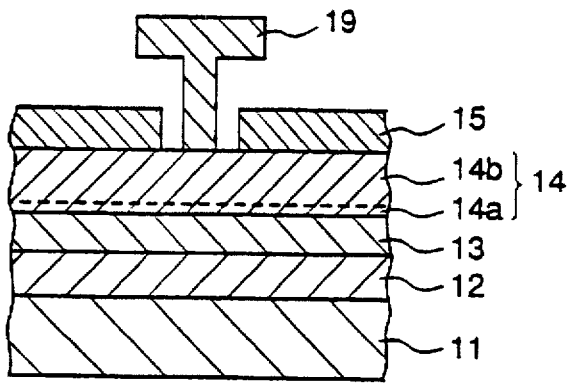
Figure 10:
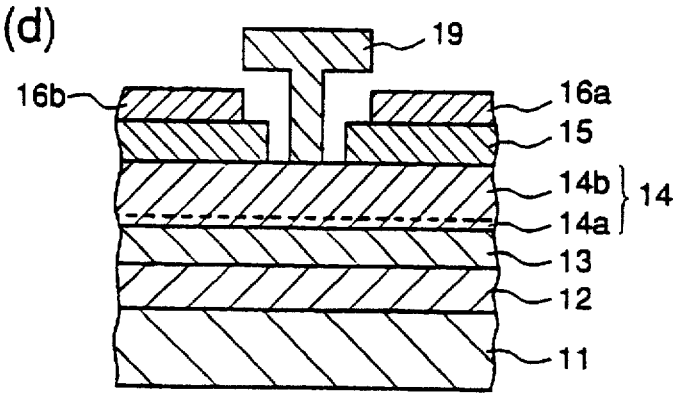

FIGS. 8(a)–8(c) are cross-sectional views illustrating process steps in a method of fabricating a MESFET according to a fifth embodiment of the present invention. In these figures, reference numeral 1 designates a semi-insulating InP substrate, numeral 2 designates an undoped InP buffer layer, numeral 30 designates an n type active layer comprising Si-doped InGaAs, numeral 4 designates a WSi layer, numerals 4a and 4b designate a source electrode and a drain electrode, respectively, numeral 5 designates a gate electrode comprising Ti/Au, numeral 6 designates a photoresist, and numeral 30a designates a gate recess.

In the method of fabricating a MESFET according to this fifth embodiment, the etchant according to the second embodiment, i.e., an aqueous solution comprising citric acid, ammonium citrate, and hydrogen peroxide in which the mol ratio of ammonium citrate to citric acid is not less than 2, is employed in formation of a gate recess.

A description is given of the fabrication process.

Initially, as illustrated in FIG. 8(a), a buffer layer 2 and an n type active layer 30 are grown on an InP substrate 1 by MBE or MOCVD and, further, a WSi layer 4 is deposited on the n type active layer 3 by sputtering. Thereafter, as illustrated in FIG. 8(b), a photoresist 6 is formed on the WSi layer 4 and patterned using conventional photolithographic techniques to produce an opening in a region where a gate electrode is later fabricated. Using the photoresist 6 as a mask, the WSi layer 4 exposed in the opening of the photoresist 6 is wet-etched selectively with respect to the n type active layer 3, using the etchant according to the second embodiment of the invention, i.e., an aqueous solution comprising citric acid, ammonium citrate, and hydrogen peroxide in which the mol ratio of ammonium citrate to citric acid is not less than 2, whereby a source electrode 4a and a drain electrode 4b are fabricated. Since the WSi layer 4 is wet-etched, the source to drain distance is larger than the width of the opening of the photoresist 6.

Using the photoresist 6 as a mask, a Ti/Al layer (not shown) is deposited by EB deposition, and unnecessary portions of the Ti/Al layer on the photoresist 6 are removed with the photoresist 6 by the lift-off technique to produce a gate electrode 5, completing a MESFET as shown in FIG. 8(c).

In the prior art method of fabricating a MESFET shown in FIGS. 9(a)–9(d), since RIE using a fluorine-based gas mixture is employed as an etching method for producing the source and drain electrodes, fluorine adheres to and infiltrates into the n type active layer that is exposed as a result of the RIE, whereby the carrier concentration of the active layer is unfavorably reduced. In this fifth embodiment of the invention, however, since wet-etching using the etchant according to the second embodiment, i.e., an aqueous solution comprising citric acid, ammonium citrate, and hydrogen peroxide in which the mol ratio of ammonium citrate to citric acid is not less than 2, is used for formation of the source and drain electrodes 4a and 4b, the adhesion or infiltration of fluorine is avoided, whereby a MESFET with an n type active layer having a desired carrier concentration is realized.

Furthermore, since the source and drain electrodes 4a and 4b are formed by isotropic wet etching, the source to drain distance is larger than the width of the opening of the photoresist 6. Therefore, the gate electrode 5 can be formed by deposition and lift-off using the photoresist 6, and the second photoresist 6b for forming the gate electrode used in the prior art method can be dispensed with, whereby the fabrication process is simplified.

Further, in the prior art method of fabricating a MESFET, since different resist patterns are used for the formation of the source and drain electrodes and the formation of the gate electrode, when the source to drain distance is reduced, positioning of the resist pattern for the gate electrode is made difficult and, therefore, it is difficult to reduce the source to drain distance. In this fifth embodiment of the invention, however, since the photoresist pattern 6 is used for both the formation of the gate electrode 5 and the formation of the source and drain electrodes 4a and 4b, even when the source to drain distance is reduced, the gate electrode 5 is produced in a desired position with high precision. Therefore, the source resistance and the drain resistance can be reduced by reducing the source to drain distance, whereby the maximum cut-off frequency can be increased.

Although in this fifth embodiment of the invention an Si-doped InGaAs layer is used for the n type active layer 30, Si-doped InAlAs may be used for the active layer 30. In this case, as an etchant used in the etching process for forming the source and drain electrodes, the etchant according to the first embodiment of the invention, that is, an aqueous solution comprising citric acid, ammonium citrate, and hydrogen peroxide in which the mol ratio of ammonium citrate to citric acid is not less than 1, is employed. Also in this case, the same effects as provided by the fifth embodiment are realized.

What is claimed is:

1. A semiconductor device comprising:
   an InP substrate;
   an undoped InAlAs buffer layer, an undoped InGaAs active layer, and an n-type InAlAs electron supply layer, successively disposed on the InP substrate;
   a T-shaped gate electrode disposed on the n-type electron supply layers the T-shaped gate electrode having an upper overhanging part;
   n-type InGaAs cap layers on the n-type electron supply layer at opposite sides of and spaced part from the T-shaped gate electrode, each cap layer having a portion positioned beneath the upper overhanging part of the T-shaped gate electrode; and a source electrode and a drain electrode respectively disposed on the cap layers, each of the source and drain electrodes having a portion positioned beneath the upper overhanging part of the T-shaped gate electrode and comprising WSi.

2. A semiconductor device comprising:

an InP substrate;

an undoped InAlAs buffer layer, an undoped InGaAs active layer, and an n-type InAlAs electron supply layer, successively disposed on the InP substrate;

a T-shaped gate electrode disposed on the n-type electron supply layer, the T-shaped gate electrode having first and second upper overhanging parts;

first and second n-type InGaAs cap layers disposed on the n-type electron supply layer at opposite sides of and spaced apart from the T-shaped gate electrode, each of the first and second cap layers having a portion positioned directly between the electron supply layer and, respectively, the first and second overhanging parts of the T-shaped gate electrode; and a source electrode and a drain electrode respectively disposed on the first and second cap layers, the source electrode having a portion positioned directly between the first upper overhanging part of the T-shaped gate electrode and the first cap layer, and the drain electrode having a portion positioned directly between the second upper overhanging part of the T-shaped gate electrode and the second cap layer, the source and drain electrodes comprising WSi.

* * * * *

UNITED STATES PATENT AND TRADEMARK OFFICE
CERTIFICATE OF CORRECTION

PATENT NO. : 5,895,941
DATED : April 20, 1999
INVENTOR(S) : TOSHIAKI KITANO

It is certified that error appears in the above-identified patent and that said Letters Patent is hereby corrected as shown below:

Column 12, line 63, change "layers" to --layer,--.

Signed and Sealed this

Second Day of November, 1999

Attest:

Q. TODD DICKINSON

*Attesting Officer*  *Acting Commissioner of Patents and Trademarks*